US008502720B1

(12) United States Patent
Wyville

(10) Patent No.: US 8,502,720 B1
(45) Date of Patent: Aug. 6, 2013

(54) PARALLEL DIGITAL TO ANALOG CONVERSION WITH IMAGE SUPPRESSION

(75) Inventor: Mark Wyville, Ontario (CA)

(73) Assignee: Telefonaktiebolaget L M Ericsson, Stockholm (SE)

( * ) Notice: Subject to any disclaimer, the term of this patent is extended or adjusted under 35 U.S.C. 154(b) by 0 days.

(21) Appl. No.: 13/438,619

(22) Filed: Apr. 3, 2012

(51) Int. Cl.
*H03M 1/66* (2006.01)

(52) U.S. Cl.
USPC ............... 341/144; 702/98; 702/99; 702/189; 348/445; 348/574; 348/695; 370/524; 375/244; 375/322; 375/347; 381/117; 381/119; 381/317; 341/143; 341/147; 341/149

(58) Field of Classification Search
USPC ....... 341/140–154; 702/98, 99, 189; 370/524; 375/244, 322, 347; 381/117, 119, 317; 348/445, 348/574, 695
See application file for complete search history.

(56) References Cited

U.S. PATENT DOCUMENTS

| 5,528,240 | A | * | 6/1996 | Wilson et al. | 341/143 |
| 5,552,785 | A | * | 9/1996 | Wilson et al. | 341/143 |
| 5,574,454 | A | * | 11/1996 | Wilson et al. | 341/143 |
| 5,625,358 | A | * | 4/1997 | Wilson et al. | 341/143 |
| 5,760,722 | A | * | 6/1998 | Harris et al. | 341/143 |
| 5,764,541 | A | * | 6/1998 | Hermann et al. | 341/167 |
| 5,930,301 | A | | 7/1999 | Chester et al. | |
| 7,187,318 | B1 | | 3/2007 | Lee et al. | |
| 2006/0050807 | A1 | | 3/2006 | Kroeger | |
| 2009/0189561 | A1 | | 7/2009 | Patel et al. | |

OTHER PUBLICATIONS

C. Krall, C. Vogel and K. Witrisal "Time-interleaved digital-to-analog converters for UWB signal generation," IEEE ICUWB 2007, pp. 366-371, Nov. 2007.
S. Balasubramanian and W. Khalil, "Direct digital-to-RF digital-to-analogue converter using image replica and non-linearity cancelling architecture," Electronic Letters, vol. 46, No. 14, pp. 1030-1032, Jul. 2010.
J. Deveugele, P. Palmers and M.S.J. Steyaert, "Parallel-path digital-to-analog converters for Nyquist signal generation," IEEE Journal of Solid-State Circuits, vol. 39, No. 7, pp. 1073-1082, Jun. 2004.
P.T.M. van Zeijl and M. Collados, "On the attenuation of DAC aliases through multiphase clocking," IEEE Trans on Circuits and Systems II: Express Briefs, vol. 56, No. 3, pp. 190-194, Mar. 2009.

* cited by examiner

*Primary Examiner* — Lam T Mai
(74) *Attorney, Agent, or Firm* — Myers Bigel Sibley & Sajovec, P.A.

(57) ABSTRACT

A digital to analog conversion apparatus includes a plurality of gain/phase adjusters configured to receive a digital signal and to output a plurality of adjusted digital input signals, a plurality of digital to analog converters coupled to respective ones of the plurality of gain/phase adjusters and configured to receive the adjusted digital input signals and to generate respective analog signals representative of the adjusted digital input signals, a plurality of phase shift elements coupled to respective ones of the plurality of digital to analog converters and configured to shift the phases of the analog signals generated by the digital to analog converters, and a combiner coupled to the outputs of the plurality of digital to analog converters and configured to combine the respective phase-shifted analog signals to form an analog output signal.

18 Claims, 10 Drawing Sheets

PARALLEL DIGITAL TO ANALOG CONVERSION WITH IMAGE SUPPRESSION

FIELD

The present invention relates to digital signal processing in communication systems. In particular, the present invention relates to digital to analog converters for use in digital communication systems.

BACKGROUND

In modern telecommunication systems, such as mobile radio and satellite communication systems, communication signals are typically processed in digital form. Digital processing of communication signals provides a number of advantages, as digital representations of signals can be easily stored, manipulated, encoded, encrypted, etc., by a communication device. Digital processors are used in modern telecommunications devices to perform these complex processing tasks while adhering to reasonable power and size constraints. However, in order to transfer information stored in digital form to another communication device over a communication medium, the digital representation of the signal must first be converted into an analog signal. This conversion process is performed by a digital-to-analog converter (DAC).

FIG. 1 is a block diagram of a transmitter architecture that uses an RF DAC. As discussed below, an RF DAC performs both digital to analog conversion and frequency up-conversion of the resulting analog signal. As shown in FIG. 1, the transmitter includes a processor 10 that generates a stream of digital information to be transmitted, an encoder 12 that encodes the digital information for transmission, and an RF DAC 14 that converts the digital information into an analog signal. A typical DAC operates by generating an output pulse having a voltage level that corresponds to a digital signal value and holding the voltage level for a predetermined time period. This process is referred to as "sample and hold" or "S&H."

The modulated signal output by the RF DAC 14 is then passed through a bandpass filter 22 having a center frequency corresponding to the frequency of the carrier signal. The filtered signal is then amplified by an amplifier 24 and transmitted using an antenna 20.

The signal output by the encoder 12 may be an oversampled digital signal that represents an analog signal that is to be transmitted by the transmitter. "Sampling" refers to the process of digitizing an analog signal. Sampling of an analog signal is illustrated in FIG. 2A, which is a graph of a signal 30 which is a sine wave that has been sampled at discrete intervals corresponding to a sampling frequency $f_S=1/T_S$, where $T_S$ is the spacing between samples. The samples 32, which are indicated as dots on FIG. 2A, can be used to reconstruct the signal 30 provided the sampling frequency is at least twice the frequency of the signal 30. The frequency that is one-half the sampling frequency, which represents the highest frequency component of a signal that can be accurately reproduced from a sampled version of the signal, is referred to as the Nyquist frequency. That is $f_N=f_S/2$, where $f_N$ is the Nyquist frequency and $f_S$ is the sampling frequency.

As shown in FIG. 2B, the samples 32 can also correspond to other sine waves, such as the higher frequency sine wave 34 that is superimposed onto the signal 30, even though the higher frequency component of the sine wave 34 did not exist in the original signal 30. This effect is referred to as "aliasing." The higher frequency sine wave 34 is referred to as an aliased signal or an "image" of the original signal 30.

As shown in FIG. 2C, other aliased signals are generated when the original signal 30 is digitized. These aliased signals appear at frequencies that are related to the frequency $f_O$ of the original signal 30 and the sampling frequency $f_S$. In particular, the aliased signals appear at frequencies that are spaced apart by $f_O$ Hz from multiples of the sampling frequency $f_S$.

A signal is said to be oversampled when it is sampled at a sampling frequency that is more than twice the highest frequency component of the analog signal (i.e. more than twice the Nyquist frequency).

When a digital signal is converted to analog, the aliased images present in the digital signal remain in the analog signal. Before the signal is transmitted, it is desirable to remove unwanted images from the analog signal.

SUMMARY

A digital to analog conversion apparatus according to some embodiments includes a plurality of gain/phase adjusters configured to receive a digital signal and to output a plurality of adjusted digital input signals, a plurality of digital to analog converters coupled to respective ones of the plurality of gain/phase adjusters and configured to receive the adjusted input signals and to generate respective analog signals representative of the adjusted digital input signals, a plurality of phase shift elements coupled to respective ones of the plurality of digital to analog converters and configured to shift the phases of the analog signals generated by the digital to analog converters to form phase-shifted analog signals, and a combiner coupled to the outputs of the plurality of digital to analog converters and configured to combine the respective phase-shifted analog signals to form an analog output signal. Each of the plurality of phase shift elements may have a different analog phase response Transfer functions of the plurality of gain/phase adjusters may be selected based on phase shifts of the plurality of phase shift elements to cause undesired signal images in the analog signals output by the digital to analog converters to combine destructively in the combiner.

At least one undesired signal image within the analog signals output by the digital to analog converters may be attenuated by the combiner.

The digital to analog converter may include an RF digital to analog converter, and undesired signal images within the analog signals output by the digital to analog converters in a plurality of Nyquist zones may be attenuated by the combiner.

The digital to analog converter may include an RF digital to analog converter, and signal images within a Nyquist zone of interest may not be substantially attenuated by the digital to analog conversion apparatus.

The plurality of phase shift elements may include a plurality of delay lines having different electrical lengths that are configured to delay the analog signals generated by the digital to analog converters by defined time delays.

The plurality of phase shift elements may include a plurality of phase shifters configured to provide predetermined phase responses over a range of frequencies.

The plurality of phase shift elements may include inputs coupled to outputs of respective ones of the digital to analog converters and outputs coupled to the combiner.

The digital to analog conversion apparatus may further include a local oscillator and a plurality of mixers, with each of the plurality of mixers coupled to a respective one of the digital to analog converters. The plurality of phase shift elements may include inputs coupled to an output of the local oscillator and outputs coupled to respective ones of the plurality of mixers, and outputs of the plurality of mixers may be coupled to the combiner.

A digital to analog conversion apparatus according to further embodiments includes a plurality of gain/phase adjusters configured to receive a digital signal and to output a plurality of adjusted digital input signals, a plurality of digital to analog converters coupled to respective ones of the plurality of gain/phase adjusters and configured to receive the adjusted digital input signals and to generate respective analog signals representative of the adjusted digital input signals, a plurality of phase shift elements coupled to respective ones of the plurality of digital to analog converters and configured to convert the analog signals generated by the digital to analog converters into phase-shifted analog signals, and a combiner coupled to the outputs of the plurality of digital to analog converters and configured to combine the respective phase-shifted analog signals to form an analog output signal. The plurality of digital to analog converters have different sample and hold times that are selected to cause undesired signal images in the analog signals to combine destructively in the combiner.

A digital to analog conversion apparatus according to some embodiments includes a plurality of gain/phase adjusters configured to receive a digital signal and to output a plurality of adjusted digital input signals, a plurality of digital to analog converters configured to receive the adjusted digital input signals and to generate respective analog signals representative of the adjusted digital input signals, a multi-phase clock generator configured to generate selected phase shifts and to provide the selected phase shifts to respective ones the plurality of digital to analog converters, and a combiner coupled to the outputs of the plurality of digital to analog converters and configured to combine the respective phase-shifted analog signals to form an analog output signal. The phase shifts generated by the multi-phase clock generator are selected to cause undesired signal images in the analog signals output by the digital to analog converters to combine destructively in the combiner.

A method of performing digital to analog conversion of a digital signal according to some embodiments includes splitting a digital signal into a plurality of digital signals, adjusting the plurality of digital signals using a plurality of gain/phase adjusters having respective transfer functions to form adjusted digital signals, performing digital to analog conversion on the adjusted digital signals to form a plurality of analog output signals, delaying the analog output signals to form delayed analog output signals, and combining the delayed analog output signals. Undesired signal images in the analog output signals generated by the digital to analog converters may combine destructively.

The method may further include selecting transfer functions of the plurality of gain/phase adjusters based on the delay applied to the corresponding delayed analog output signals to cause undesired signal images in the analog signals output by the digital to analog converters to combine destructively.

At least one undesired signal image within the analog signals output by the digital to analog converters may be substantially attenuated when the delayed analog signals are combined.

Undesired signal images within the analog signals output by the digital to analog converters in a plurality of Nyquist zones may be attenuated when the delayed analog signals are combined.

Signal images within a Nyquist zone of interest may not be substantially attenuated when the delayed analog signals are combined.

Delaying the analog output signals may include delaying each of the analog signals different time delays.

It is noted that aspects of the invention described with respect to one embodiment may be incorporated in a different embodiments although not specifically described relative thereto. That is, all embodiments and/or features of any embodiments can be combined in any way and/or combination. These and other objects and/or aspects of the present invention are explained in detail in the specification set forth below.

Other systems, methods, and/or computer program products according to embodiments of the invention will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising,"

"includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 3:
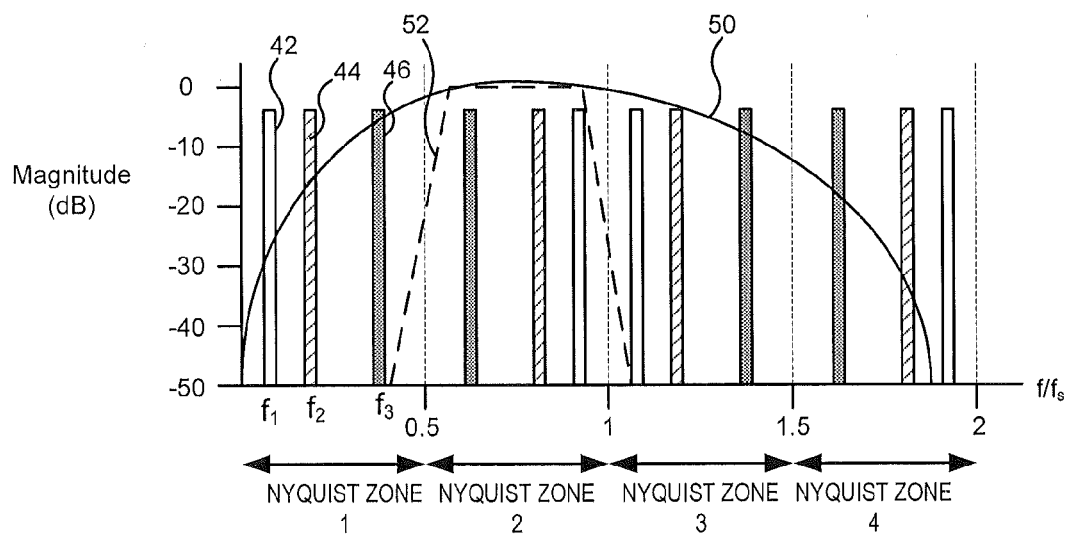
FIG. 3 illustrates filtering of signal images in an analog signal output by a digital to analog converter.

An example frequency spectrum of three oversampled digital signals 42, 44 and 46 is shown in FIG. 3, which is a graph of signal magnitude as a function of normalized frequency $f/f_S$. Because of the aliasing effect discussed above, an image of each signal appears in each zone from $f/f_S=0$ to $f/f_S=0.5$, from $f/f_S=0.5$ to $f/f_S=1$, etc. Each of these zones is referred to herein as a "Nyquist zone." Each of the three signals has been upconverted in the digital domain by a different frequency. That is, within Nyquist zone 1 from f/fs=0 to $f/f_S=0.5$, each of the three signals is centered at a different frequency $f_1$, $f_2$, $f_3$.

Although multiple images of each signal exist in the digitized signal, it is desirable to transmit only one of each of the images. In a conventional DAC, the desired images lie within the first Nyquist zone. However, in some cases it is desirable to transmit an image lying in a different Nyquist zone. As used herein, a DAC is referred to as an "RF DAC" if at least one of the desired images is in a different Nyquist zone from Zone 1. In the example illustrated in FIG. 3, the desired signals lie in the second Nyquist zone. Accordingly, the desired signal images are centered at $f_S$-$f_1$, $f_S$-$f_2$ and $f_S$-$f_3$.

When implementing an RF DAC, it is important that the desired images are not significantly attenuated by the sample-and-hold (S&H) frequency response of the DAC. This requirement is met when the S&H frequency response has a large magnitude near the sampling rate ($f_S=1$). For example, the RF DAC frequency response curve 50 shown in FIG. 3 has a large magnitude near f/fs=1. The mixMode™ RF DAC manufactured by Analog Devices, Inc., satisfies this requirement.

Figure 1:
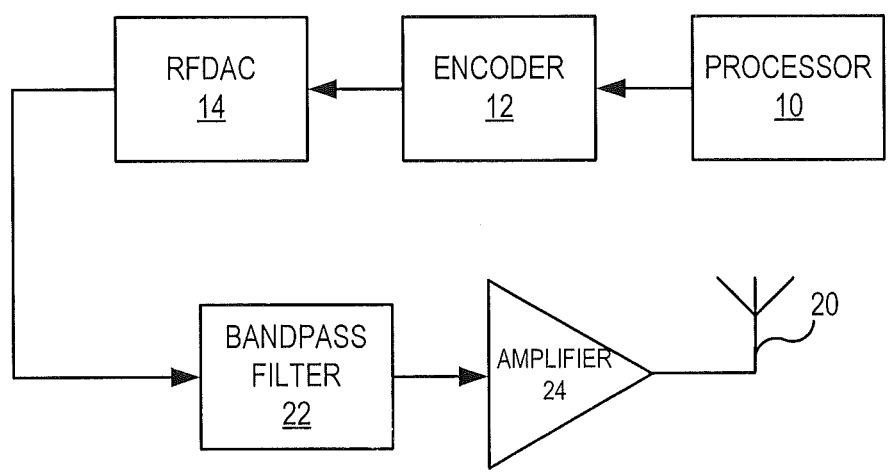
FIG. 1 is a simplified block diagram of a transmitter in a digital communication system.
Figure 2A:
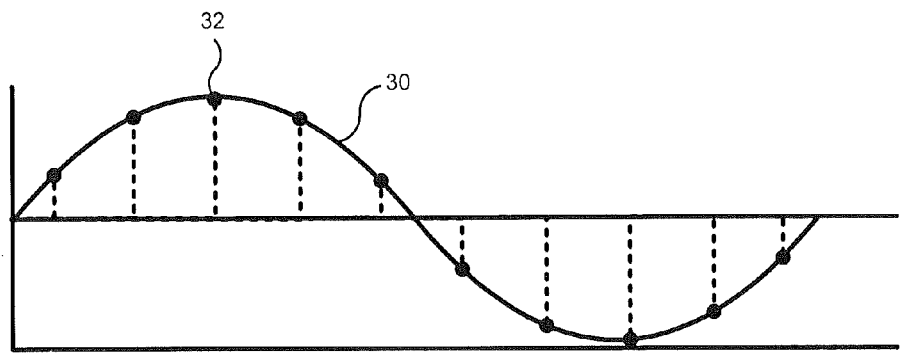
FIGS. 2A-2C illustrate digital sampling of analog signals and aliasing that results from sampling of analog signals.
Figure 2B:
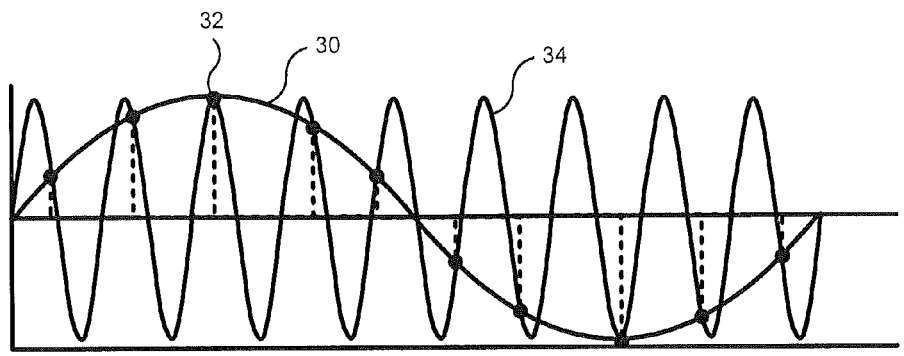
Figure 2C:
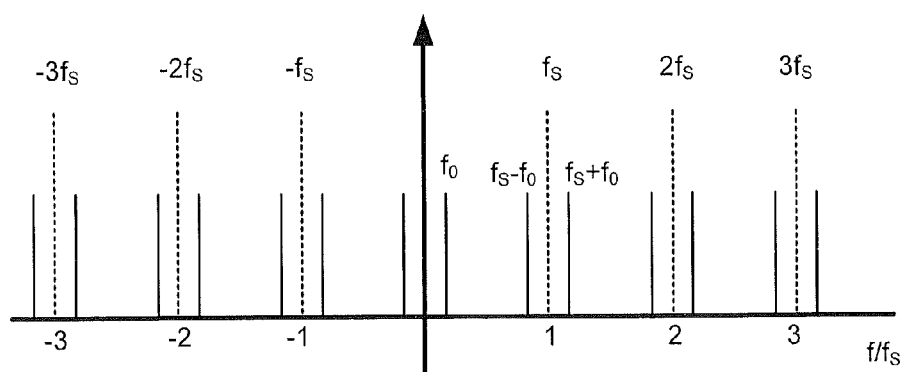

Before the signal is sent to a power amplifier for transmission, the undesired images must be filtered out. This is typically done using an analog bandpass filter, such as the bandpass filter 22 shown in FIG. 1. Filter selectivity refers to how quickly the filter response decreases outside the filter passband. Filter selectivity is characterized by the sharpness of the filter response edge (i.e., how steep the sides of the filter response are). A characteristic filter response is shown in FIG. 3 as curve 52. The filter response 52 defines the passband of the bandpass filter, which corresponds to the location of the desired signal images in Nyquist zone 2. As can be seen in FIG. 3, the selectivity demands on the bandpass filter increase if the desired images are close to either side of their Nyquist zones. The RF DAC frequency response curve 50 in FIG. 3 shows that DAC may not provide any relief to this filtering issue.

As the selectivity demands of an analog bandpass filter increase, the filter complexity increases, and the amount of phase distortion in the passband increases. These problems increase when very wideband signals or multi-frequency signals with large frequency separations are to be transmitted. The resulting filtering requirements are extremely challenging, and may require multiple cascaded filter designs, which are complex and expensive.

Embodiments of the invention provide a DAC architecture including multiple parallel DACs arranged in a manner that suppresses at least one of the aliased signal images that is present at the output of a single DAC. With N parallel DACs, N−1 images can be suppressed.

DAC architectures including multiple DACs have been proposed as a means of suppressing undesired image replicas, which may reduce the filter requirements. For example, the multiple DAC architectures disclosed in C. Krall, C. Vogel and K. Witrisal "Time-interleaved digital-to-analog converters for UWB signal generation," IEEE ICUWB 2007, pp. 366-371, November 2007, S. Balasubramanian and W. Khalil, "Direct digital-to-RF digital-to-analogue converter using image replica and non-linearity cancelling architecture," Electronic Letters, vol. 46, no. 14, pp. 1030-1032, July 2010, and J. Deveugele, P. Palmers and M. S. J. Steyaert, "Parallel-path digital-to-analog converters for Nyquist signal generation," IEEE Journal of Solid-State Circuits, vol. 39, no. 7, pp. 1073-1082, June 2004, digitally interpolate the digital signal with an N-times up-sampling rate and send successive data samples to the N-DAC's.

These approaches may not be robust to phase errors in clock signals provided to the DACs or to non-idealities in the analog components that follow the DACs. In P. T. M. van Zeijl and M. Collados, "On the attenuation of DAC aliases through multiphase clocking," IEEE Trans on Circuits and Systems II: Express Briefs, vol. 56, no. 3, pp. 1549-7747, March 2009, the same digital signal is sent to each of N DACs without interpolation. The image suppression decreases as the signal bandwidth increases. However the attenuation bandwidth of one image can be improved at the expense of decreasing the ability to attenuate another image (i.e. can suppress N−1 narrowband images or (N−1)/2 wider band images).

According to some embodiments of the present invention, the outputs of multiple parallel DACs are combined in the analog domain. The digital signal to be converted to analog is split into multiple input signals, which are adjusted prior to being sent through the parallel DAC paths so that when the analog signals output by the DACs are combined, the undesired images add destructively causing the undesired images to be attenuated. To promote destructive addition of the undesired images, each parallel DAC path may exhibit a different phase response in the analog domain.

Embodiments of the invention may be applicable to conventional DACs as well as to RF DACs. This means that the desired image(s) can be in any Nyquist zone, as can the undesired images.

Figure 4:
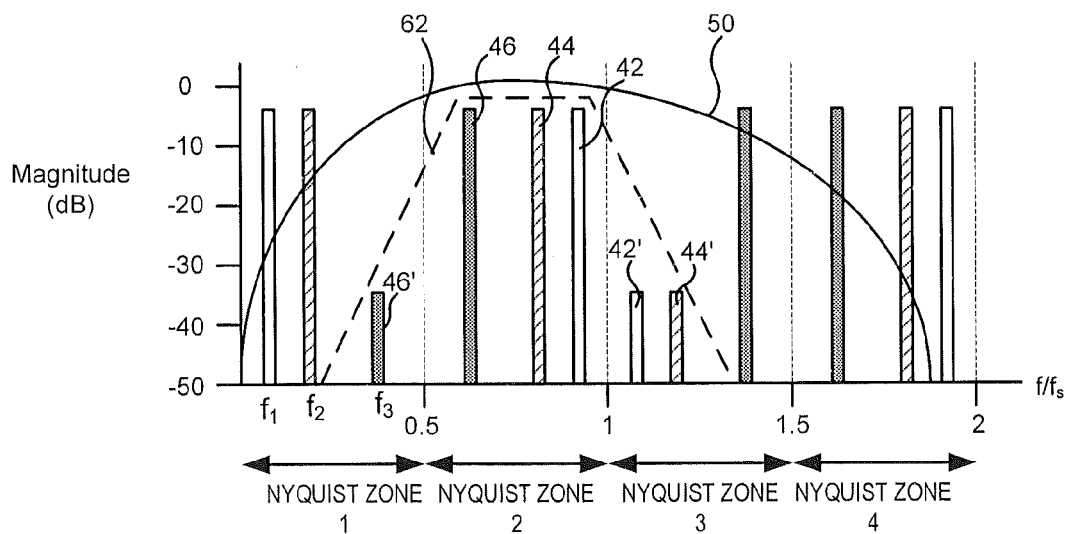
FIGS. 4, 5 and 6 illustrate filtering of signal images in an analog signal output by a digital to analog converter according to various embodiments.
Figure 5:
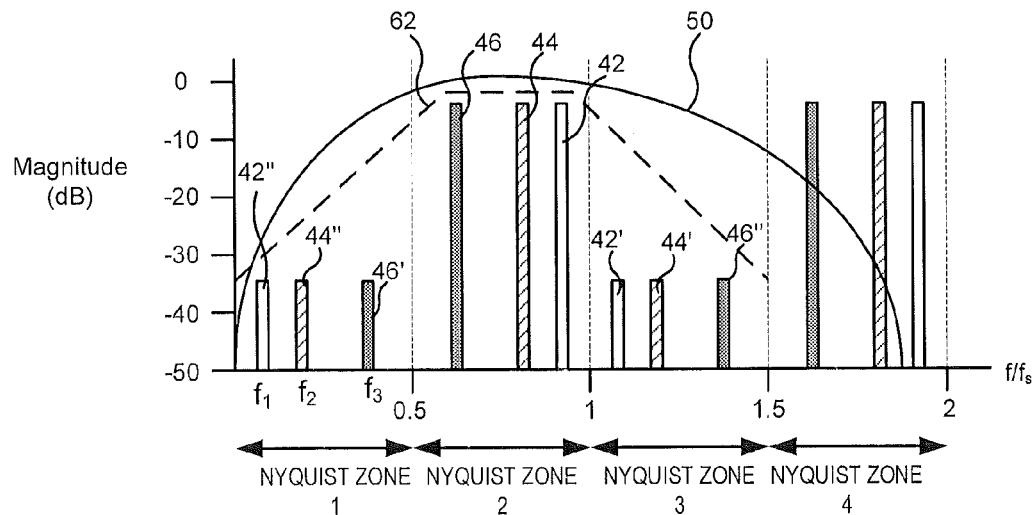

In a first embodiment, all of the desired images are in the same Nyquist zone. For example, referring to FIG. 4, the desired images 42, 44 and 46 are all in Nyquist zone 2 from $f/f_S=0.5$ to $f/f_S=1$. In these embodiments, the images 42', 44' and 46' in adjacent Nyquist zones can be suppressed, thereby permitting the analog bandpass filter requirements to be relaxed, so that he analog bandpass filter has a longer roll-off with less sharp cutoffs. In the example of FIG. 4, one image per occupied channel is attenuated (images 42', 44', and 46'), leading to relaxed filtering requirements (compared to FIG. 3). The suppression of one image per channel may be obtained with a two-DAC system. If three parallel DACs are used, two undesired images may be attenuated per occupied channel (42', 42", 44', 44", 46' and 46"), as shown in the example of FIG. 5. This may permit even further relaxation of the analog bandpass filter requirements.

Figure 6:
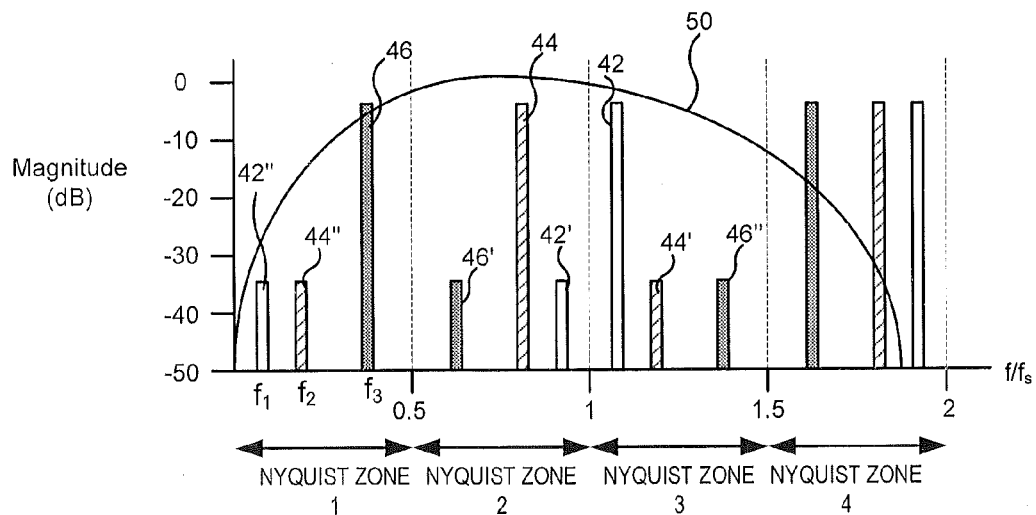

In a second embodiment, the desired images are not in the same Nyquist zone. For example, referring to FIG. 6, the desired images 42, 44 and 46 are in three different Nyquist zones, as are six signal images that are attenuated (42', 42", 44', 44", 46' and 46") by operation of the parallel DAC. This embodiment may use at least three parallel DACs, where each DAC provides operation over a Nyquist zone. This second embodiment may provide an output similar to that of a single very wideband DAC. However, the image suppression requirements are increased in these embodiments, because undesired images would not filtered out by a bandpass filter, and may therefore need to be suppressed to an even greater degree.

Parallel DAC architectures according to embodiments of the invention are illustrated in FIGS. 7A, 7B, 7C and 8-12. These architectures can be used to obtain different phase responses in the analog domain across the N DAC paths, resulting in attenuation of undesired signal images as described above.

Figure 7A:
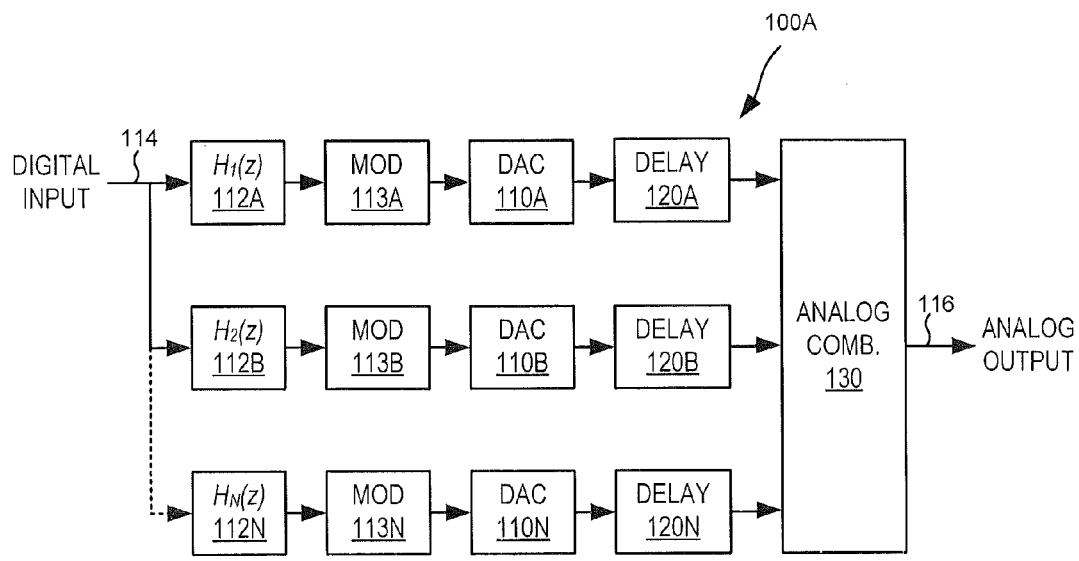
FIGS. 7A, 7B, 7C and 8 to 12 illustrate digital to analog conversion apparatus including parallel digital to analog converters in accordance with various embodiments.

Referring to FIG. 7A, a parallel digital to analog conversion circuit 100A includes a plurality of DACs 110A, 110B, 110N connected in parallel. Although three DACs are illustrated in FIG. 7A, it will be appreciated that the DAC apparatus 100 could include less than three (i.e., two) or more than three (i.e. four or more) parallel DACs, depending on the number of undesired signal images it is designed to suppress.

A plurality of digital gain/phase adjusters 112A, 112B, 112N, each having a respective transfer function $H_1(z)$, $H_2(z)$, $H_N(z)$, are connected to the inputs of a respective plurality of modulation blocks 113A-113N that perform frequency up-conversion, interpolation and quadrature modulation. The outputs of the modulation blocks 113A-113N are coupled to respective ones of the DACs 110A-110N.

The digital gain/phase adjusters 112A-112N receive the digital input signal 114 that is to be converted to analog and precondition the signals so that the undesired images in the digital signal can combine destructively when the analog signals are combined. The gain/phase adjusters 112A, 112B, 112N could be implemented after the DACs as analog equalizers. However, such a configuration may be more difficult and costly to implement and control compared to performing the adjustment in the digital domain.

In order for the undesired signal images to combine destructively, it is also desirable for the phases of the analog signals to be adjusted. In the embodiments of FIG. 7A, this is accomplished by placing delay lines 120A, 120B, 120N having different electrical (delay) lengths at the respective outputs of the DACs 110A-110N. The delay lines shown in FIG. 7A may provide a very predictable frequency response over a wide frequency range. The delay lines are connected to an analog combiner 130 which combines the analog signals to form a combined analog output signal 116 in which undesired signal images are suppressed as discussed above.

Figure 7B:
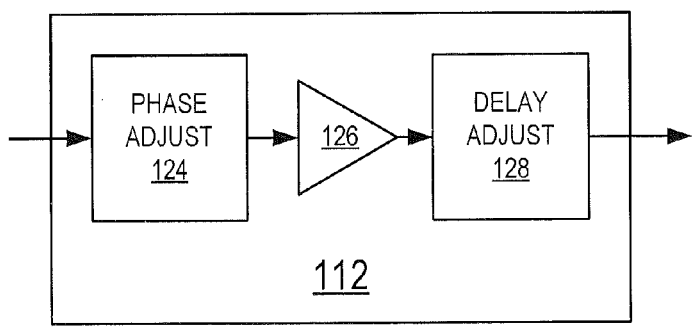

FIG. 7B is a block diagram of a gain/phase adjuster 112. As shown therein, a gain/phase adjuster 112 includes a phase adjust block 124 and a gain adjust block 126. The gain/phase adjuster may also include a group delay adjust block 128. The order of the blocks in the gain/phase adjuster 112 may be different than that shown in FIG. 7B. Furthermore, it will be appreciated that in a given implementation any or all of the blocks may be set to have zero adjustment, e.g., the phase adjust block 124 may be set to adjust the phase by 0 degrees, the gain adjust block 126 may be set to adjust the gain by 0 dB, and/or the delay adjust block 128 may be set to adjust the group delay by 0 seconds.

Figure 7C:
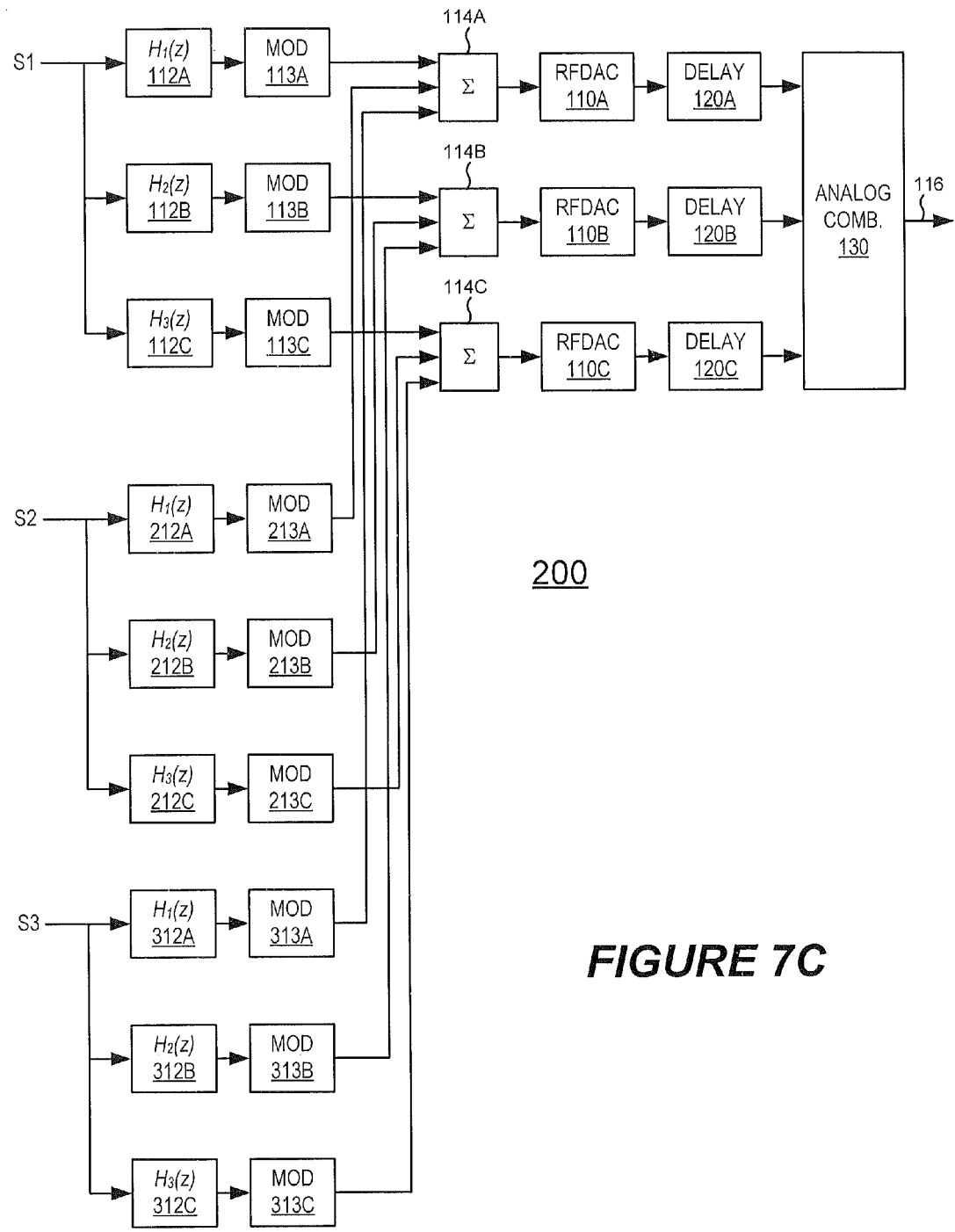

FIG. 7C is a detailed block diagram of a system 200 including three RF DACs that processes three digital input signals S1, S2 and S3. The first input signal S1 is processed by gain/phase adjusters 112A-112C and modulation blocks 113A-113C; the second input signal S2 is processed by gain/phase adjusters 212A-212C and modulation blocks 213A-213C, and the third input signal S3 is processed by gain/phase adjusters 312A-312C and modulation blocks 313A-313C. The modulation blocks 113A-113C up-convert the frequency of the first signal S1 to a first frequency $f_1$. Similarly, the modulation blocks 213A-213C up-convert the frequency of the second signal S2 to a second frequency $f_2$, and the modulation blocks 313A-313C up-convert the frequency of the third signal S3 to a third frequency $f_3$.

Outputs of the modulation blocks 113A, 213A and 313A are summed at a combiner 114A; outputs of the modulation blocks 113B, 213B and 313B are summed at a combiner 114B, and outputs of the modulation blocks 113C, 213C and 313C are summed at a combiner 114C. The output of the combiner 114A is provided to a first RF DAC 110A and analog delay line 120A, the output of the combiner 114B is provided to a second RF DAC 110B and analog delay line 120B, and the output of the combiner 114C is provided to a third RF DAC 110C and analog delay line 120C. The outputs of the analog delay lines 120A-120C are combined at an analog combiner 130 to form a combined analog signal 116.

The delay of the first analog delay line 120A may be ⅛th of the RF DAC sampling clock period, and the delay of the second analog delay line 120B may be ¼th of the sampling clock period, and there may be no delay provided by the third analog delay line 120C. In some embodiments, the third gain/phase adjuster 112C, 212C, 312C in each path may only provide a group delay adjustment that compensates for the nominal delay inherent to the group delay adjusters in the other two paths and may not perform any gain or phase adjustment.

The transfer functions of the gain/phase adjusters may be determined as follows. After processing, the image of the first signal S1 in the first Nyquist zone (at frequency $f_1$) may be represented as:

$$S_1(f)[H_1(f)\exp(-j2\pi f_1\tau_1)+H_2(f)\exp(-j2\pi f_1\tau_2)+H_3(f)\exp(-j2\pi f_1\tau_3)] \quad [1]$$

where $\tau_1$, $\tau_2$, and $\tau_3$ represent the delays of the analog delay lines 120A, 120B, 120C.

The image in the second Nyquist zone (at $f_s-f_1$) may be represented as:

$$S_1(f)[H_1^*(-f)\exp(-j2\pi(f_s-f_1)\tau_1)+H_2^*(-f)\exp(-j2\pi(f_s-f_1)\tau_2)+H_3^*(-f)\exp(-j2\pi(f_s-f_1)\tau_3)] \quad [2]$$

The image in the third Nyquist zone (at $f_s+f_1$) may be represented as:

$$S_1(f)[H_1(f)\exp(-j2\pi(f_s+f_1)\tau_1)+H_2(f)\exp(-j2\pi(f_s+f_1)\tau_2)+H_3(f)\exp(-j2\pi(f_s+f_1)\tau_3)] \quad [3]$$

Assuming it is desirable for the images in the first and second zones to be equal to zero, then these quantities are set equal to zero or unity, as follows:

$$S_1(f)[H_1(f)\exp(-j2\pi f_1\tau_1)+H_2(f)\exp(-j2\pi f_1\tau_2)+H_3(f)\exp(-j2\pi f_1\tau_3)]=0 \quad [4]$$

$$S_1(f)[H_1^*(-f)\exp(-j2\pi(f_s-f_1)\tau_1)+H_2^*(-f)\exp(-j2\pi(f_s-f_1)\tau_2)+H_3^*(-f)\exp(-j2\pi(f_s-f_1)\tau_3)]=0 \quad [5]$$

$$S_1(f)[H_1(f)\exp(-j2\pi(f_s+f_1)\tau_1)+H_2(f)\exp(-j2\pi(f_s+f_1)\tau_2)+H_3(f)\exp(-j2\pi(f_s+f_1)\tau_3)]=1 \quad [6]$$

Similar equations can be written for the second and third input signals S2, S3. Assuming the H(f) values are constants (phase and gain only), then this reduces to a set of three linear equations with 3 unknowns, which can be solved in closed form. The addition of the group delay adjust is used to counteract the group delays of the analog delays.

Figure 8:
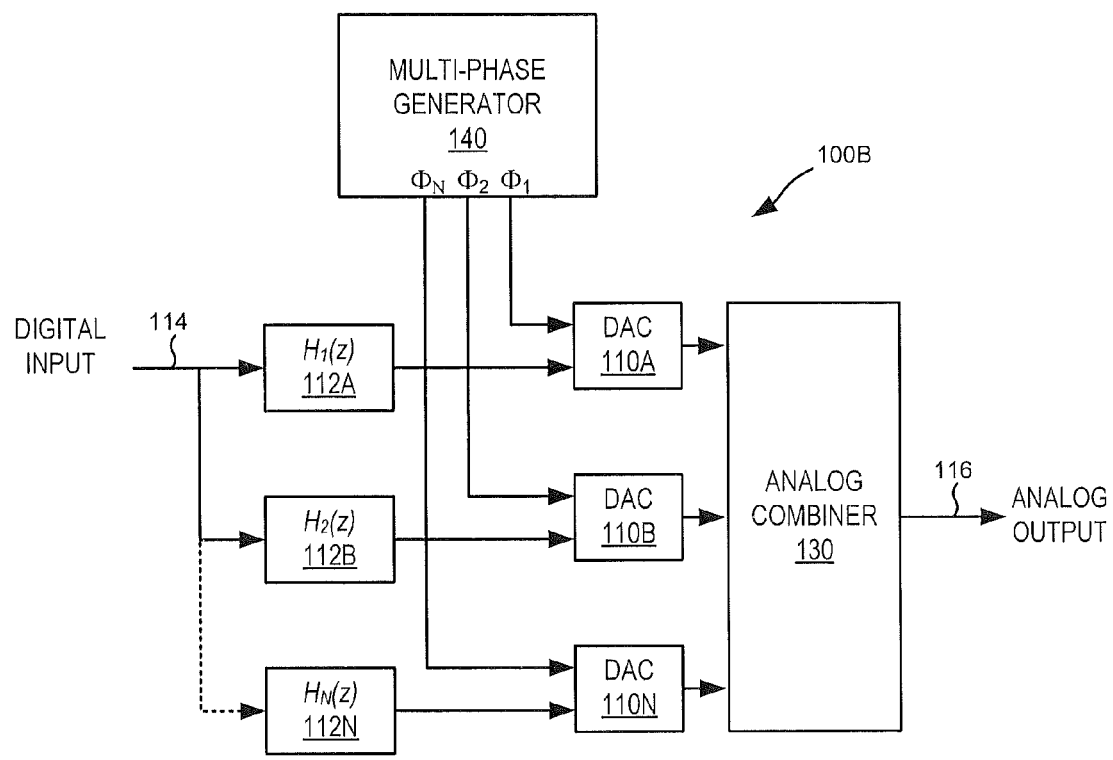

Referring to FIG. 8, embodiments of the invention are illustrated in which the DACs 110A-110N are fed with phase offset clocks (the modulation blocks are omitted from the drawing for simplicity). In particular, FIG. 8 illustrates a digital to analog conversion circuit 100B that includes a plurality of DACs 110A-110N connected in parallel. As in the embodiments of FIG. 7, a plurality of digital gain/phase adjusters 112A, 112B, 112N, each having a respective transfer function $H_1(z)$, $H_2(z)$, $H_N(z)$, receive the digital input signal 114 that is to be converted to analog and are connected to the input of a respective one of the DACs 110A, 110B, 110N.

A multiphase clock generator 140 generates a plurality of clock signals with phase offset values $\phi_1$ to $\phi_N$ and provides the phase offset clock signal values $\phi_1$ to $\phi_N$ to the DACs 110A-110N. The phase values $\phi_1$ to $\phi_N$ are used to control the phase of the operation of the DACs 110A-110N, so that the analog signals output by the DACs 110A-110N have a predetermined phase relationship.

The analog signals output by the DACs 110A-110N are provided to an analog combiner 130, which combines the analog signals to form a combined analog output signal 116.

The multi-phase clock generator 140 in FIG. 8 permits the DACs 110A-110N to be directly connected at the analog combiner 130. The technique of using a multi-phase clocks shown in FIG. 8 is mathematically equivalent (in terms of analog phase response) to the delay line technique used in the apparatus 110A of FIG. 7A.

Figure 9:
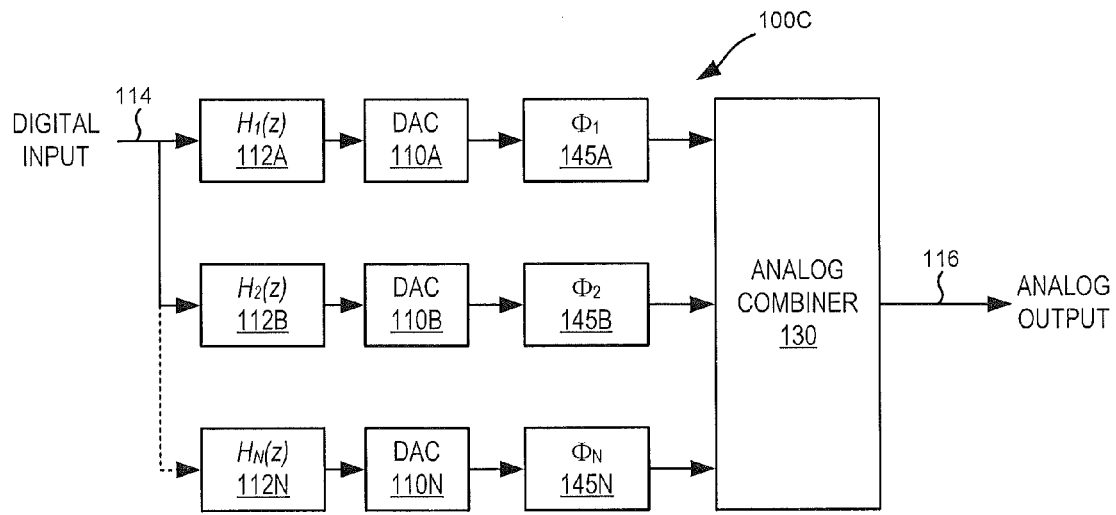

FIG. 9 illustrates a digital to analog conversion circuit 100N including a plurality of DACs 110A-110N in which phase shifters 145A, 145B, 145N are coupled to the DAC outputs. As in the embodiments of FIG. 7A, a plurality of digital gain/phase adjusters 112A, 112B, 112N, each having a respective transfer function $H_1(z)$, $H_2(z)$, $H_N(z)$, receive the digital input signal 114 that is to be converted to analog and are connected to the input of a respective one of the DACs 110A-110N. The phase shifters 145A-145N provide the signals output by the DACs 110A-110N with a preselected phase shift across a range of operating frequencies. The analog signals output by the phase shifters 145A-145N are provided to an analog combiner 130 which combines the analog signals to form a combined analog output signal 116 having attenuated signal images.

The phase shifters 145A-145N in FIG. 9 can theoretically provide improved performance relative to the embodiments of FIGS. 7A and 8. However, in practice, it may be difficult to obtain a constant phase shift over a wide frequency range.

Figure 10:
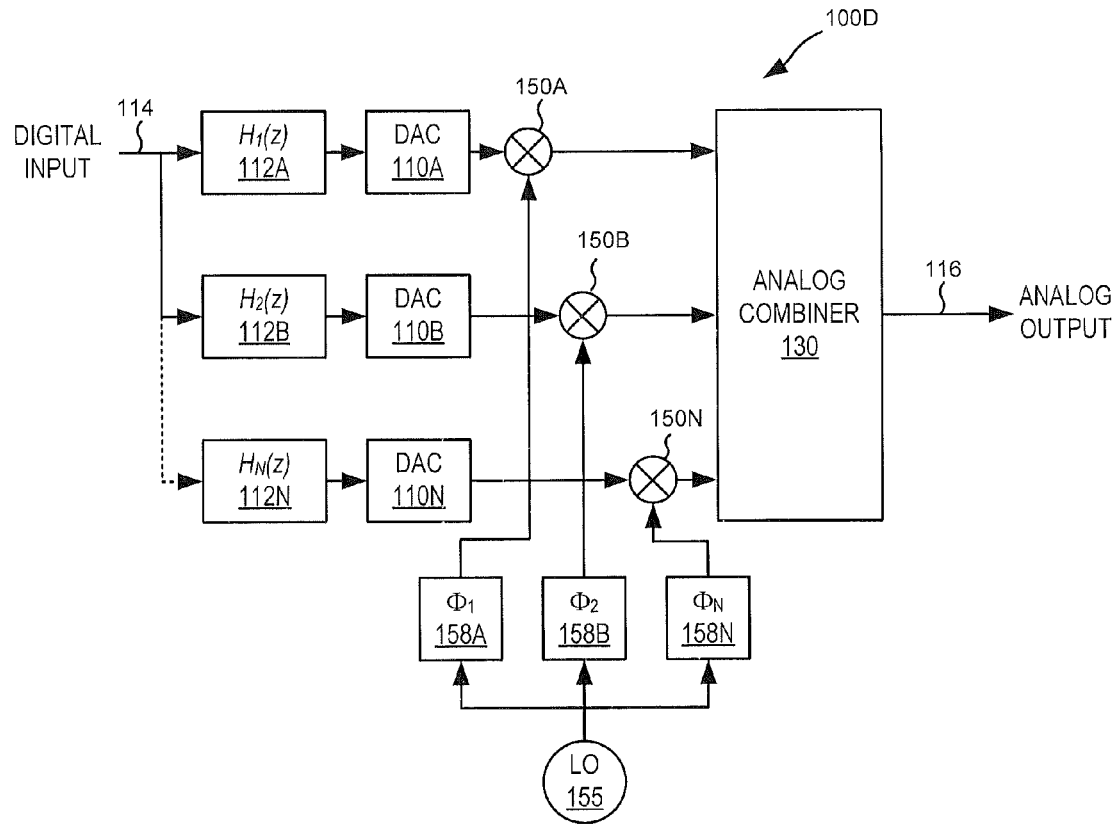

Referring to FIG. 10, a parallel digital to analog conversion circuit 100D according to further embodiments includes a plurality of DACs 110A-110N connected in parallel. A plurality of digital gain/phase adjusters 112A, 112B, 112N, each having a respective transfer function $H_1(z)$, $H_2(z)$, $H_N(z)$, is connected to the input of a respective one of the DACs 110A-110N.

In the embodiments of FIG. 10, a plurality of phase shifters 158A, 158B, 158N are placed in the paths between a local oscillator 155 and a plurality of mixers 150A, 150B, 150N that receive the analog signals output by the DACs 110A-110N and upconvert the analog signals to the frequency of the local oscillator signal. The placement of phase shifters 158A, 158B, 158N in the local oscillator paths may permit wideband phase shifting. However it may be undesirable to connect DACs (like RF DACs 110A-110N) directly to mixers before the signals are combined. The main reason for using an RF DAC is to create an analog signal that is already at RF. This shifts analog functionality into the digital domain, and does not require an analog mixer.

Figure 11:
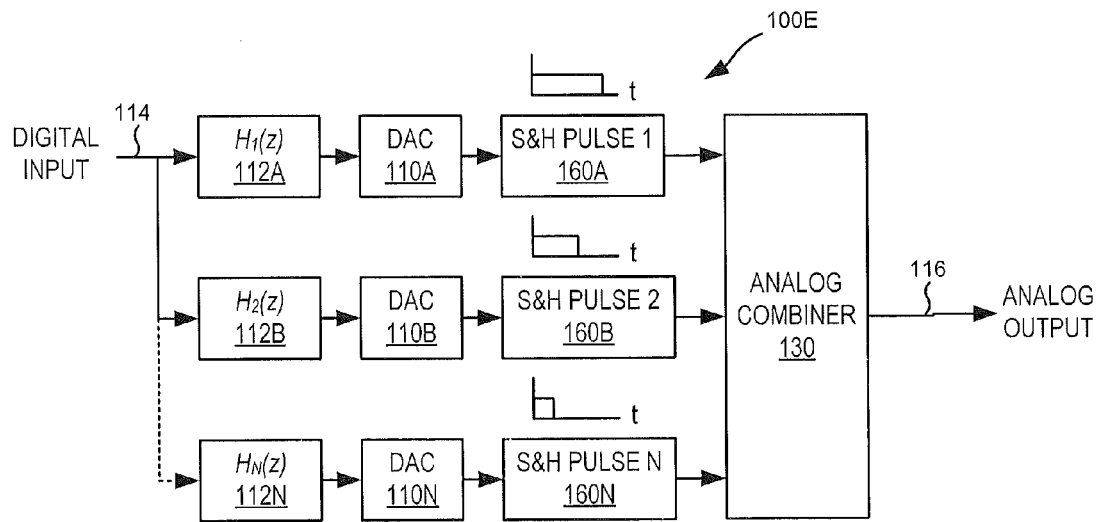

FIG. 11 illustrates an embodiment of a digital to analog conversion circuit 100E in which the S&H impulse responses of the DACs 110A, 110B, 110N are different. In FIG. 11, the S&H responses of the DACs are shown as RZ pulses 160A, 160B, 160N with different duty cycles. The precise pulse widths are not critical, provided they are different. The transfer functions of the gain/phase adjusters are selected based on the pulse widths to ensure the images are attenuated with knowledge of the frequency responses of the different S&H pulse widths.

Figure 12:
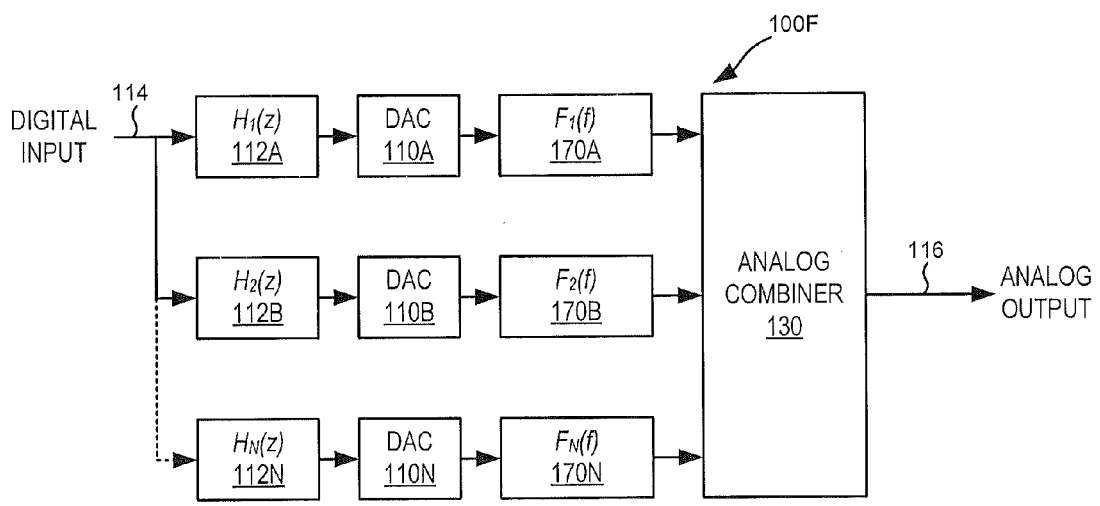

FIG. 12 illustrates an embodiment of a digital to analog conversion circuit 100F in which the analog signals output by the DACs 110A-110N are passed through processing blocks 170A, 170B, 170N having generic analog transfer functions $F_1(f)$, $F_2(f)$, $F_N(f)$. The processing blocks 170A, 170B, 170N may represent any analog component, such as a filter, having a frequency response that results in image suppression at the output of the analog combiner 130.

The techniques illustrated in the embodiments of FIGS. 7-12 may be combined. For example, a multi-phase clock as shown in FIG. 8 could be used together with DACs having different S&H impulse responses as illustrated in FIG. 11.

Figure 13:
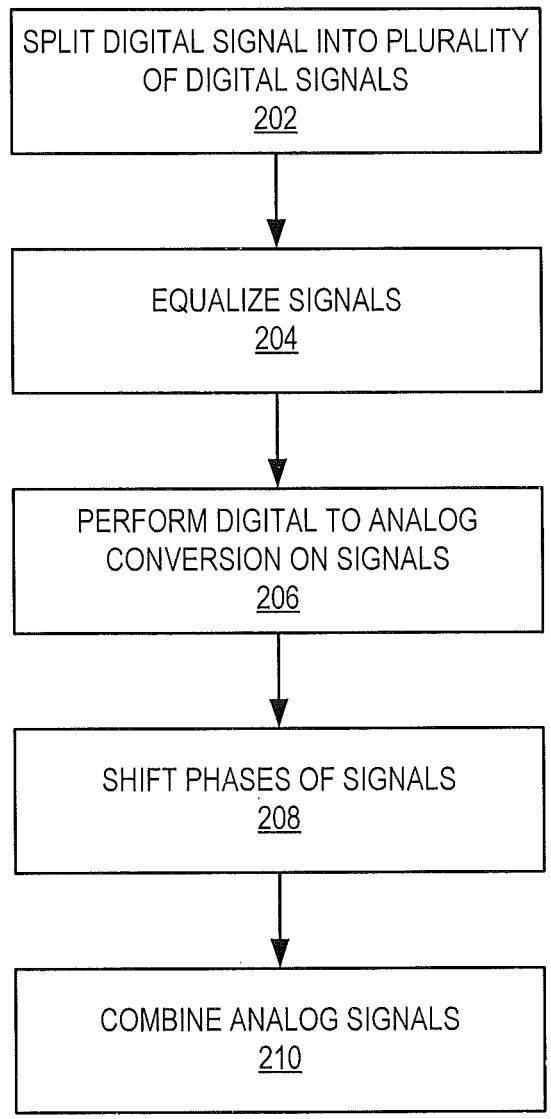
FIG. 13 is a flowchart illustrating operations according to some embodiments.

Methods of performing digital to analog conversion of a digital signal according to some embodiments are illustrated in FIG. 13. As shown therein, the methods include splitting a digital signal into a plurality of digital signals (block 202). The digital signals are then equalized using a plurality of gain/phase adjusters having respective transfer functions to form equalized digital signals (block 204) Digital to analog conversion is then performed on the equalized digital signals (block 206) to form a plurality of analog output signals. The phases of the analog output signals are shifted (block 208) to form phase-shifted analog output signals. Finally, the phase-shifted analog output signals are combined so that undesired signal images in the analog output signals combine destructively (block 210).

It is to be understood that the functions/acts noted in the blocks of FIG. 13 may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

For example, in some embodiments, equalization of the signals may occur before digital to analog conversion. Similarly, phase shifting can occur prior to and/or at the same time as digital to analog conversion in some embodiments.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A digital to analog conversion apparatus, comprising:
   a plurality of gain/phase adjusters configured to receive a digital signal and to output a plurality of adjusted digital input signals;
   a plurality of digital to analog converters coupled to respective ones of the plurality of gain/phase adjusters and configured to receive the adjusted digital input signals and to generate respective analog signals representative of the adjusted digital input signals;
   a plurality of phase shift elements coupled to respective ones of the plurality of digital to analog converters and configured to shift the phases of the analog signals generated by the digital to analog converters to form phase-shifted analog signals; and
   a combiner coupled to the outputs of the plurality of digital to analog converters and configured to combine the respective phase-shifted analog signals to form a combined analog output signal.

2. The digital to analog conversion apparatus of claim 1, wherein transfer functions of the plurality of gain/phase adjusters are selected based on phase shifts of the plurality of phase shift elements to cause undesired signal images in the analog signals output by the digital to analog converters to combine destructively in the combiner.

3. The digital to analog conversion apparatus of claim 2, wherein at least one undesired signal image within the analog signals output by the digital to analog converters is attenuated by the combiner.

4. The digital to analog conversion apparatus of claim 2, wherein the digital to analog converter comprises an RF digital to analog converter, and wherein undesired signal images within the analog signals output by the digital to analog converters in a plurality of Nyquist zones are attenuated by the combiner.

5. The digital to analog conversion apparatus of claim 2, wherein the digital to analog converter comprises an RF digital to analog converter, and wherein signal images within a Nyquist zone of interest are not substantially attenuated by the digital to analog conversion apparatus.

6. The digital to analog conversion apparatus of claim 1, wherein the plurality of phase shift elements comprise a plurality of delay lines having different electrical lengths that are configured to delay the analog signals generated by the digital to analog converters by defined time delays.

7. The digital to analog conversion apparatus of claim 1, wherein the plurality of phase shift elements comprise a plurality of phase shifters configured to provide predetermine phase responses over a range of frequencies.

8. The digital to analog conversion apparatus of claim 1, wherein the plurality of phase shift elements include inputs coupled to outputs of respective ones of the digital to analog converters and outputs coupled to the combiner.

9. The digital to analog conversion apparatus of claim 1, further comprising a local oscillator and a plurality of mixers, each of the plurality of mixers coupled to a respective one of the digital to analog converters, wherein the plurality of phase shift elements include inputs coupled to an output of the local oscillator and outputs coupled to respective ones of the plurality of mixers, wherein outputs of the plurality of mixers are coupled to the combiner.

10. The digital to analog conversion apparatus of claim 1, wherein each of the plurality of phase shift elements has a different analog phase response.

11. A digital to analog conversion apparatus, comprising:
   a plurality of gain/phase adjusters configured to receive a digital signal and to output a plurality of adjusted digital input signals;
   a plurality of digital to analog converters coupled to respective ones of the plurality of gain/phase adjusters and configured to receive the adjusted digital input signals and to generate respective analog signals representative of the adjusted digital input signals;
   a plurality of phase shift elements coupled to respective ones of the plurality of digital to analog converters and configured to convert the analog signals generated by the digital to analog converters into phase-shifted analog signals; and
   a combiner coupled to the outputs of the plurality of digital to analog converters and configured to combine the respective phase-shifted analog signals to form a combined analog output signal;
   wherein the plurality of digital to analog converters have different sample and hold times that are selected to cause undesired signal images in the analog signals to combine destructively in the combiner.

12. A digital to analog conversion apparatus, comprising:
   a plurality of gain/phase adjusters configured to receive a digital signal and to output a plurality of adjusted digital input signals;
   a plurality of digital to analog converters configured to receive the adjusted digital input signals and to generate respective analog signals representative of the adjusted digital input signals;
   a multi-phase generator configured to generate selected phase shifts and to provide the selected phase shifts to respective ones the plurality of digital to analog converters; and
   a combiner coupled to the outputs of the plurality of digital to analog converters and configured to combine the respective phase-shifted analog signals to form a combined analog output signal;
   wherein the phase shifts generated by the multi-phase generator are selected to cause undesired signal images in the analog signals output by the digital to analog converters to combine destructively in the combiner.

13. A method of performing digital to analog conversion of a digital signal, comprising:
   splitting a digital signal into a plurality of digital signals;
   adjusting the plurality of digital signals using a plurality of gain/phase adjusters having respective transfer functions to form adjusted digital signals;
   performing digital to analog conversion on the adjusted digital signals to form a plurality of analog output signals;
   delaying the analog output signals to form delayed analog output signals; and
   combining the delayed analog output signals, wherein undesired signal images in the analog output signals generated by the digital to analog converters combine destructively.

14. The method of claim 13, further comprising selecting transfer functions of the plurality of gain/phase adjusters based on the delay applied to the corresponding delayed analog output signals to cause undesired signal images in the analog signals output by the digital to analog converters to combine destructively.

15. The method of claim 14, wherein at least one undesired signal image within the analog signals output by the digital to analog converters is attenuated when the delayed analog signals are combined.

16. The method of claim 14, wherein undesired signal images within the analog signals output by the digital to analog converters in a plurality of Nyquist zones are attenuated when the delayed analog signals are combined.

17. The method of claim 14, wherein signal images within a Nyquist zone of interest are not substantially attenuated when the delayed analog signals are combined.

18. The method of claim 13, wherein delaying the analog output signals comprises delaying each of the analog signals different time delays.

* * * * *